United States Patent [19]
Vigna et al.

[11] Patent Number: 6,090,638
[45] Date of Patent: Jul. 18, 2000

[54] PROCESS FOR MANUFACTURING HIGH-SENSITIVITY CAPACITIVE AND RESONANT INTEGRATED SENSORS, PARTICULARLY ACCELEROMETERS AND GYROSCOPES, AND SENSORS MADE THEREFROM

[75] Inventors: Benedetto Vigna, Potenza; Paolo Ferrari, Gallarate; Marco Ferrera, Domodossola; Pietro Montanini, Melegnano, all of Italy

[73] Assignee: STMicroelectronics S.r.l., Agrate Brianza, Italy

[21] Appl. No.: 09/113,979

[22] Filed: Jul. 10, 1998

[30] Foreign Application Priority Data

Jul. 10, 1997 [EP] European Pat. Off. .............. 97830345

[51] Int. Cl.⁷ .................................................. H02L 23/48
[52] U.S. Cl. .................... 438/50; 438/51; 438/52
[58] Field of Search .................... 257/420, 414, 257/415, 417; 438/50, 51, 52, 739

[56] References Cited

U.S. PATENT DOCUMENTS

| | | | |
|---|---|---|---|
| 5,072,288 | 12/1991 | MacDonald et al. | 357/68 |
| 5,393,375 | 2/1995 | MacDonald et al. | 438/52 |
| 5,399,415 | 3/1995 | Chen et al. | 428/209 |
| 5,514,622 | 5/1996 | Bornstein et al. | 437/189 |
| 5,846,849 | 12/1998 | Shaw et al. | 438/52 |

FOREIGN PATENT DOCUMENTS

| | | | |
|---|---|---|---|
| 0 714 121 A2 | 5/1996 | European Pat. Off. . | |
| 36 4020670 | 1/1989 | Japan | 257/414 |
| 40 4192370 | 7/1992 | Japan | 257/414 |

OTHER PUBLICATIONS

Gabrielson, Thomas B., Mechanical–Thermal Noise in Micromachined Acoustic and Vibration Sensors, *IEEE Transactions On Electron Devices*, vol. 40, No. 5, May 1993, pp. 903–909.

Kuehnel, Wolfgang et al., "A Surface Micromachined Silicon Accelerometer With On–Chip Detection Circuitry," *Sensors And Actuators*, A 45, (1994) pp. 7–16.

*Primary Examiner*—Donald L. Monin, Jr.
*Assistant Examiner*—Michael Dietrich
*Attorney, Agent, or Firm*—Theodore E. Galanthay; Robert Iannucci; Seed IP Law Group PLLC

[57] ABSTRACT

A sensor having high sensitivity is formed using a suspended structure with a high-density tungsten core. To manufacture it, a sacrificial layer of silicon oxide, a polycrystal silicon layer, a tungsten layer and a silicon carbide layer are deposited in succession over a single crystal silicon body. The suspended structure is defined by selectively removing the silicon carbide, tungsten and polycrystal silicon layers. Then spacers of silicon carbide are formed which cover the uncovered ends of the tungsten layer, and the sacrificial layer is then removed.

13 Claims, 3 Drawing Sheets

PROCESS FOR MANUFACTURING HIGH-SENSITIVITY CAPACITIVE AND RESONANT INTEGRATED SENSORS, PARTICULARLY ACCELEROMETERS AND GYROSCOPES, AND SENSORS MADE THEREFROM

TECHNICAL FIELD

The invention relates to a process for manufacturing high-sensitivity integrated sensors, particularly accelerometers and gyroscopes, and related sensors.

BACKGROUND OF THE INVENTION

As is known, the use of electromechanical microstructures of semiconductor material, the manufacture of which utilizes microelectronics techniques, has recently been proposed for producing accelerometers and gyroscopes. These silicon micro-processing techniques make it possible to manufacture different types of angular velocity and acceleration sensors. In particular, at the present time prototypes operating according to the piezoelectric, piezoresistive, capacitive, threshold, resonant and tunnel effect principle of operation have been proposed.

Historically, integrated micro-structures have been manufactured by preferably using the bulk micromachining technique in which a wafer of single-crystal silicon is processed on both faces. This technique is, however, incompatible with the process phases for forming components of the circuit which processes the signal picked up by the sensitive element.

It has therefore been proposed to use the technique of surface micromachining in which the sensitive element is made of polycrystal silicon and suspended structures are formed by depositing and successively removing sacrificial layers. This technique is compatible with the current integrated circuit manufacturing processes and is therefore preferred at present. The integrated micro-structures formed with this technique are, however, relatively insensitive to acceleration and angular velocity. In fact, having a mass of the order of a few tenths of a microgram, they suffer the effects of thermodynamic noise caused by the Brownian movement of the particles of the fluid in which they are immersed (see, for example, the article by T. B. Gabrielson entitled "Mechanical-Thermal Noise in Micromachined Acoustic and Vibration Sensors", IEEE Transactions on Electron Devices, vol. 40, No. 5, May 1993). The upper limit to the mass obtainable with these structures is imposed by genuinely technological reasons; the deposition of very thick films involves extremely long wafer processing times and renders the surface of the wafer unsuitable for the successive operations such as the lapping of the wafers.

SUMMARY OF THE INVENTION

In one embodiment, the invention provides a manufacturing process to form a sensor according to surface micromachining which remedies the disadvantages of the known technique.

An embodiment of the invention provides a process for manufacturing high-sensitivity capacitive including forming a temporary support, a suspended structure that contains tungsten, and then removing the temporary support. Another embodiment includes resonant integrated sensors, particularly accelerometers and gyroscopes, comprising a suspended structure coupled to a semiconductor body wherein the suspended structure includes tungsten.

BRIEF DESCRIPTION OF THE DRAWINGS

For an understanding of the invention a preferred embodiment thereof will now be described, purely by way of non-exhaustive example, with reference to the accompanying drawings.

DETAILED DESCRIPTION OF THE INVENTION

Reference will be made below to a sensor of differential capacitive type, i.e., one in which acceleration induces the movement of a seismic mass which constitutes the electrode common to two capacitors, electrically connected, thereby varying the two capacitances in opposite directions (differential variation of capacitance). The process provided by the invention can therefore also be used to manufacture an absolute capacitive sensor or a sensor of the resonant type.

An embodiment of a capacitive-type accelerometric or gyroscopic sensor according to this process will now be described with reference to the accompanying drawings in which the thicknesses of the various layers of material are not to scale and some layers are not shown in all the drawings for reasons of representation.

Figure 1:
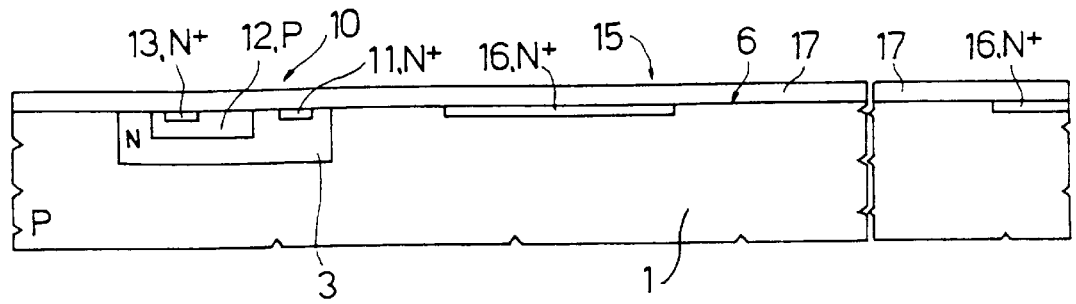
FIGS. 1–10 show transverse sections through a wafer of semiconductor material in different zones of a capacitive accelerometric sensor, during different steps of the manufacturing process according to the invention.

The manufacturing process initially comprises standard steps for the manufacture of integrated circuits. In particular, in the example shown, starting with a wafer 1 of P-type single-crystal silicon comprising N-type pockets 3, the components of the circuitry are formed. Of these, FIG. 1 shows an NPN transistor 10 having an $N^+$-type collector contact region 11, a P-type base region 12 and an $N^+$-type emitter region 13. Furthermore, in a zone 15 of the wafer 1 intended to support the seismic mass (also called sensor zone 15 below), $N^+$-type connection or "runner" regions 16, facing a surface 6 of the wafer 1 for the electrical connection of the seismic mass, are formed at the same time as the regions 11 and 13.

A dielectric layer 17 for the opening of the contacts, such as BPSG (Boron Phosphorus Silicon Glass), is then deposited on the surface 6 of the wafer, obtaining the intermediate structure of FIG. 1. Then, by means of a suitable mask and selective removal step, part of the dielectric layer 17 is removed from the sensor zone 15, obtaining the structure of FIG. 2.

A silicon oxide layer 18 which, in the sensor zone 15, extends directly on the surface 6 of the wafer 1, is then deposited at low temperature. A silicon nitride layer 19 is then deposited at low pressure by means of CVD (Chemical Vapour Deposition), obtaining the structure of FIG. 3.

Figure 2:
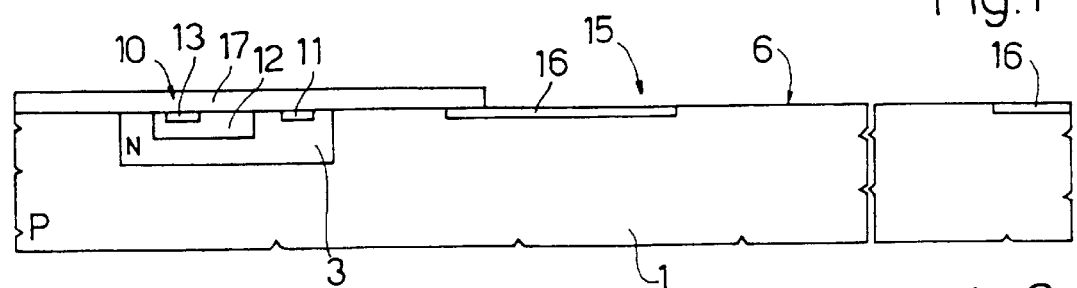
Figure 3:
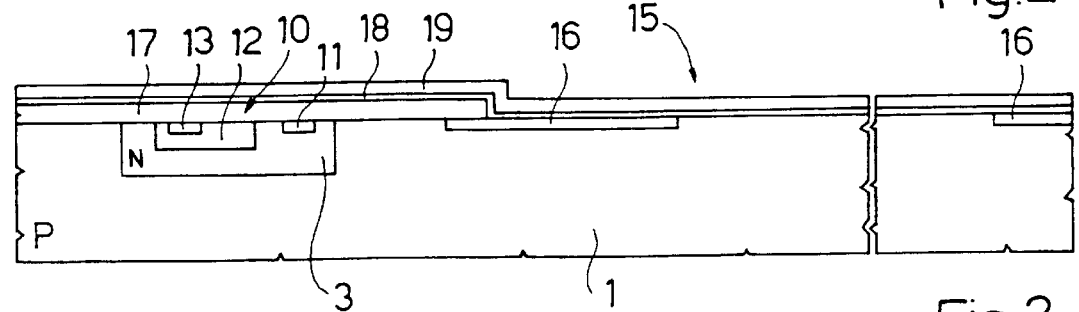
Figure 4:
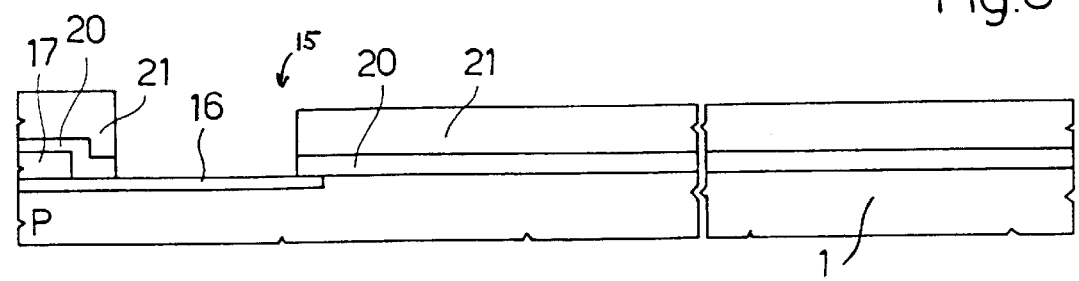
Figure 5:
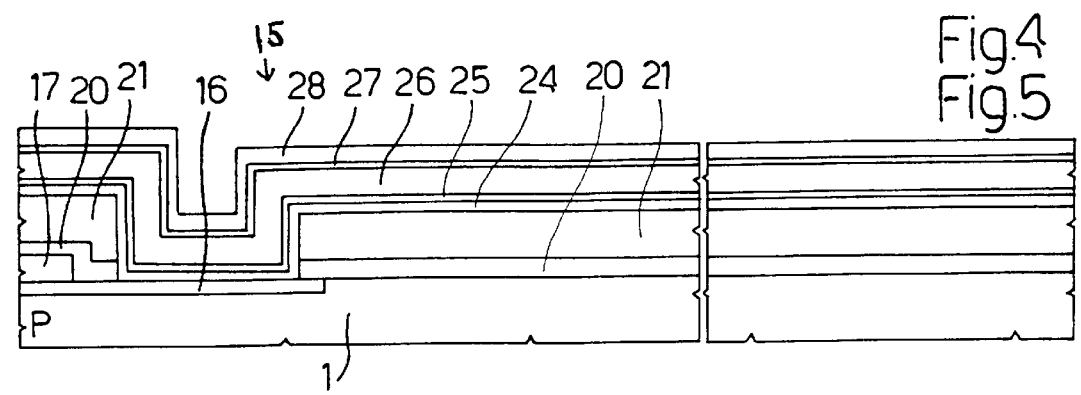

Then, as shown in FIG. 4, which is on a larger scale than FIGS. 1–3 and displaced so as to show the sensor zone 15 only, a sacrificial layer 21 of silicon oxide of approximately 2 μm thickness is deposited on the double layer 20 formed by the silicon oxide 18 and silicon nitride 19 layers. The sacrificial layer 21 is removed, together with the double layer 20 beneath, at the connection regions 16 where anchorages for the movable mass are to be formed (FIG. 4). There are then deposited, in succession, a thin polycrystal silicon layer 24 (approximately 0.35 μm thick for example); a first adhesive layer 25 (of titanium nitride for example), to facilitate the adhesion of the next layer to the layer 24; a tungsten layer 26 (1 μm thick for example); a second adhesive layer 27 (of titanium nitride for example); and then a first silicon carbide layer 28 (0.2 μm for example), thus obtaining the structure of FIG. 5. In the zones where the sacrificial layer 21 has been removed (above the connection regions 16) the layers 24, 26 and 28 thus form anchorages 41 for the seismic mass.

Figure 6:
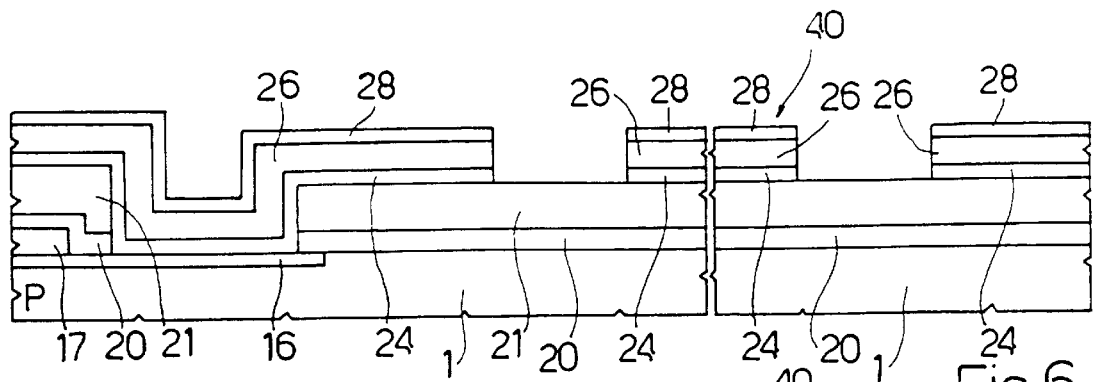
Figure 7:
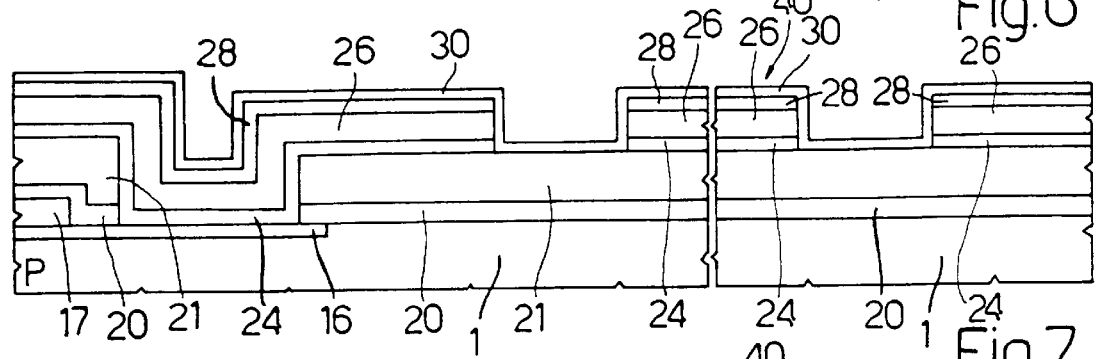
Figure 8:
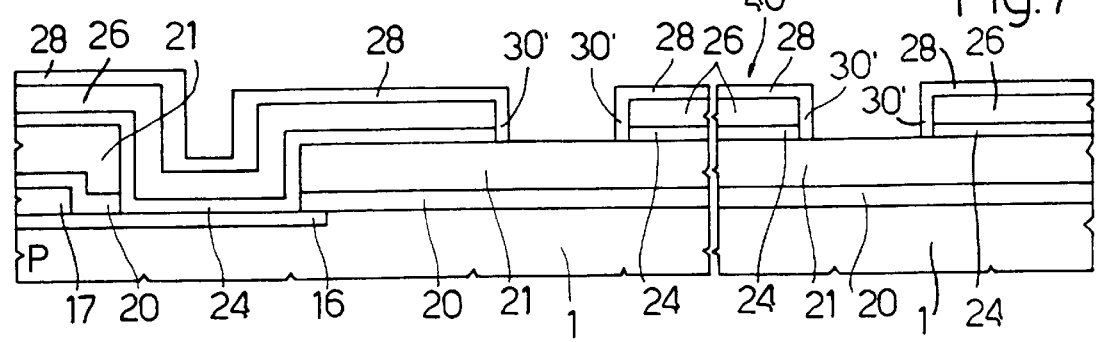

The suspended micro-structure 40 is then defined, by masking and anisotropic etching the first carbide layer 28, the tungsten layer 26 and the polycrystal silicon layer 24 as far as the sacrificial layer 21, thus obtaining the structure of FIG. 6, in which (as in the subsequent ones) the adhesive layers 25 and 27 are not shown, for greater clarity. Then, shown in FIG. 7, a second silicon carbide layer 30 is deposited, approximately 0.2 μm thick, which covers and forms a single layer with the first silicon carbide layer 28 when this is present, even though, in FIG. 7, the layers 28 and 30 have been shown separately for reasons of representation. A step of anisotropic etching of the carbide is then carried out so as completely to remove the portions of the layer 30 in direct contact with the sacrificial layer 21 and leaving the portions which cover the uncovered ends of the tungsten layer 26, so as to form "spacers" of silicon carbide denoted by 30' in FIG. 8.

Figure 9:
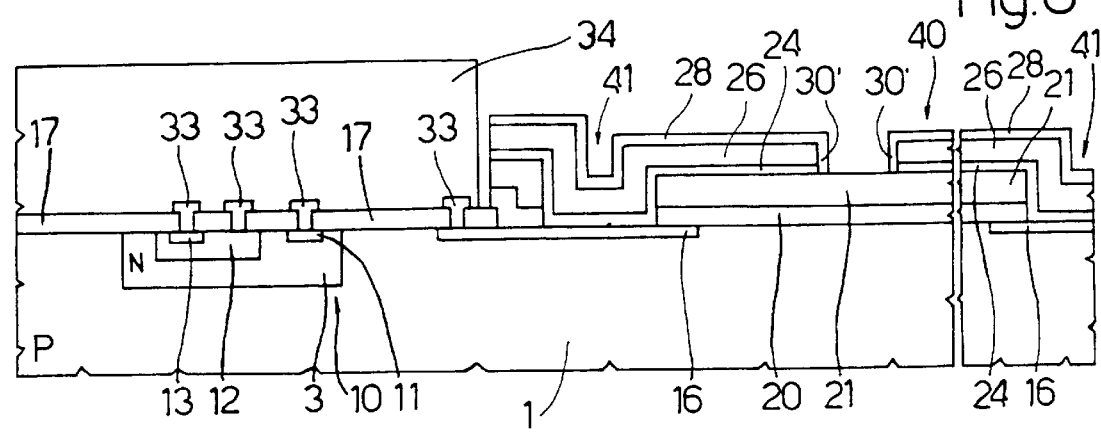

The sacrificial layer 21 and the silicon nitride layer 20 are then removed from the zone of the circuitry. The structure is then masked to form the openings of the contacts of the circuitry and of the sensitive element through the layer 17. A metallic layer is deposited and defined to form the contacts 33 (visible in FIG. 9 which relates to a section similar to those of FIGS. 1–3, also showing part of the control circuit) and the metallic interconnections. A dielectric material passivation layer 34 is deposited and then removed in the zone of the contact pad (to permit the electrical contacting of the device) and in the sensor zone 15, thus obtaining the structure of FIG. 9.

Figure 10:
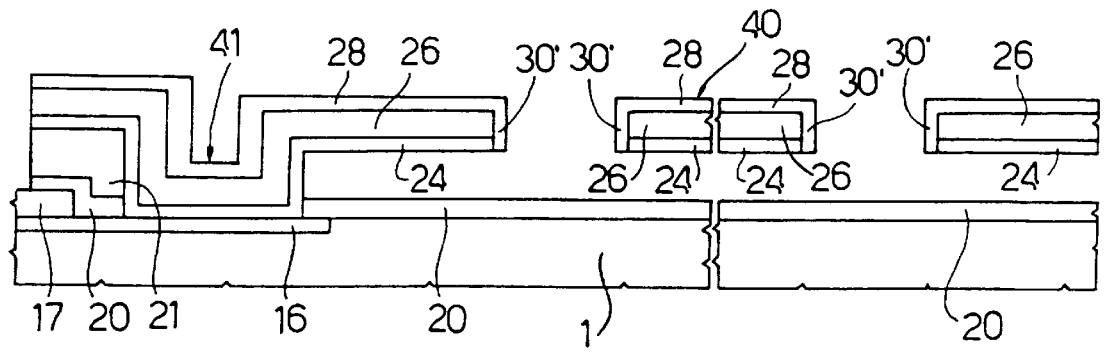
Figure 11:
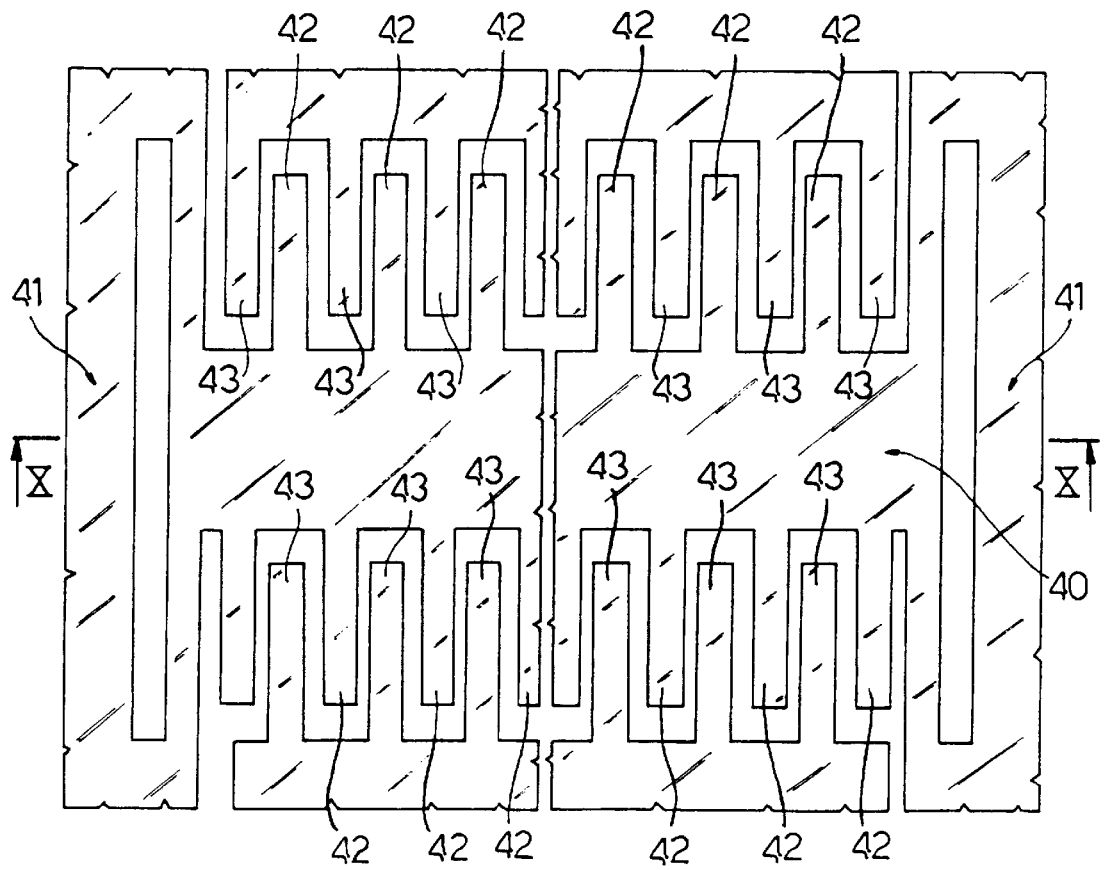
FIG. 11 shows a top view of the sensor obtained through the present process.

Then, by a suitable mask, the sacrificial layer 21 is removed in, for example, hydrofluoric acid in the sensor zone 15 while the polysilicon dielectric layer 24 underneath, the carbide layer 28 on the top and the spacers 30' at the sides protect the tungsten layer 26 from the etching. A suspended structure 40 (FIG. 10) is thus obtained, the external profile of which is shown in FIG. 11 and which is anchored to the wafer 1 by means of the anchorage regions 41. In particular, shown in FIG. 11, the suspended structure 40 is H-shaped with a plurality of transverse walls 42 defining the movable electrodes of the capacitive sensor which are interleaved in a comb-like manner with respective fixed transverse walls 43, defining the fixed electrodes. The structure is therefore equivalent to a capacitor formed by two capacitors in series, each formed by a plurality of elementary capacitors connected in parallel.

In a known manner the movable electrodes 42 and the fixed electrodes 43 are biased at different voltages so that when the suspended structure 40 is subjected to an acceleration the consequent change of distance between the movable electrodes and the fixed ones may be detected as a variation of capacitance.

The manufacture of the suspended mass of semiconductor material with a tungsten core, as described, gives the sensor high sensitivity. In fact, tungsten has high density (19.3 g/cm$^3$) with respect to polycrystal or amorphous silicon (2.33 g/cm$^3$). Consequently, a tungsten layer 1 μm thick is virtually equivalent, from the point of view of the mechanical properties, to a 10 μm polysilicon layer. On the other hand, the deposition by CVD of a tungsten of the thickness quoted does not have the disadvantages which a silicon layer ten times thicker does have.

The sensor obtained in this way thus has high sensitivity and yet benefits from the advantages typical of "surface micromachining" technology.

In particular, the manufacturing process is simple to implement, using steps typical of microelectronics, is readily controllable and repeatable as well as economical. In fact, despite the need to deposit several layers as well as adhesion layers, a single mask is sufficient to form the suspended structure.

Finally it will be clear that numerous modifications and variants may be introduced to the process and sensor described and illustrated herein, all coming within the scope of the inventive concept as defined in the accompanying claims. In particular, the process can also be applied to sensors of a different type operating according to the capacitive or resonant principle of operation; the components of the circuitry integrated with the sensor may be both bipolar and MOS; the conductivity of the conductive regions may be the opposite of that shown and the protective and/or adhesive materials may be replaced by others which are equivalent as regards the functions desired.

What is claimed is:

1. An integrated sensor, comprising:
   a suspended structure having a tungsten region, and positioned over a semiconductor material body, and connected to said semiconductor material body through anchorage portions; and
   a protective structure comprising silicon portions coupled to and surrounding the tungsten region, wherein said protective structure comprises a region of polycrystalline silicon disposed directly underneath said tungsten region and silicon carbide regions positioned over and at sides of said tungsten region.

2. The sensor according to claim 1 wherein said protective structure is resistant to etching sacrificial material.

3. The sensor according to claim 1 wherein said anchorage portions comprise a tungsten core, the sensor further comprising electrical connection regions inside said semiconductor material body, also underneath and electrically connected to said anchorage portions.

4. The sensor according to claim 1 wherein said semiconductor material body is covered by a silicon nitride layer with the exception of said anchorage portions.

5. An integrated sensor, comprising:
   a suspended structure having a tungsten region, and positioned over a semiconductor material body, and connected to said semiconductor material body through anchorage portions; and
   a protective structure comprising silicon portions coupled to and surrounding the tungsten region, wherein said protective structure comprises a region of polycrystalline silicon disposed underneath said tungsten region and silicon carbide regions positioned over and at sides of said tungsten region wherein a first adhesive layer is present between said tungsten region and said region of polycrystalline silicon and wherein a second adhesive layer is present between said tungsten region and said silicon carbide regions.

6. An integrated sensor, comprising:
   a semiconductor substrate;
   a suspended structure suspended over the semiconductor substrate to form a gap between the suspended structure and the semiconductor substrate, the suspended structure including a tungsten region and a protective layer having portions of silicon coupled to and surrounding the tungsten region, wherein said protective layer comprises a region of polycrystalline silicon disposed directly underneath said tungsten region and silicon carbide regions positioned over and at sides of said tungsten region; and anchorage portions laterally coupling the suspended structure to the semiconductor substrate.

7. The sensor of claim 6, further including:

electrical connection regions within the semiconductor substrate, wherein the anchorage portions are electrically connected to the electrical connection regions.

8. The sensor of claim 6 wherein the protective layer is resistive to etching of sacrificial material removed from between the suspended structure and the semiconductor substrate.

9. The sensor of claim 6, further including an adhesive layer between the tungsten region and the protective layer.

10. The sensor of claim 6 wherein portions of the semiconductor substrate are covered with a silicon nitride layer.

11. An integrated sensor, comprising:

a suspended structure having a tungsten region, the tungsten region surrounded by a protective structure resistant to etching sacrificial material, the protective structure comprising portions of silicon or portions of silicon carbide, the protective structure including a region of polycrystal silicon disposed underneath the tungsten region and a silicon carbide region positioned over and at sides of the tungsten region;

a first adhesive layer present between the tungsten region and the region of polycrystal silicon; and a second adhesive layer present between the tungsten region and the silicon carbide region.

12. An integrated sensor, comprising:

a semiconductor substrate;

a suspended structure positioned over the semiconductor substrate to form a gap between the suspended structure and the semiconductor substrate, the suspended structure including a tungsten region and a protective layer coupled to and surrounding the tungsten region, the protective layer having a lower portion comprising silicon and an upper portion comprising silicon carbide, the lower portion being directly underneath the tungsten region; and anchorage portions coupling the suspended structure to the semiconductor substrate.

13. The sensor of claim 12, further comprising another layer between the protective layer and the tungsten region.

* * * * *